United States Patent [19]
Karabed et al.

[11] Patent Number: 5,095,484
[45] Date of Patent: Mar. 10, 1992

[54] PHASE INVARIANT RATE 8/10 MATCHED SPECTRAL NULL CODE FOR PRML

[75] Inventors: Razmik Karabed, San Jose; Paul H. Siegel, La Jolla, both of Calif.

[73] Assignee: International Business Machines Company Corporation, Armonk, N.Y.

[21] Appl. No.: 747,401

[22] Filed: Aug. 19, 1991

Related U.S. Application Data

[63] Continuation of Ser. No. 434,970, Nov. 13, 1989, abandoned.

[51] Int. Cl.5 .................. H03M 13/00; H03M 7/00; G11B 20/18
[52] U.S. Cl. ....................... 371/30; 341/58; 341/94; 371/55
[58] Field of Search .............. 371/30, 42, 43, 46, 371/55, 61; 341/95, 58, 94

[56] References Cited

U.S. PATENT DOCUMENTS

| | | | |
|---|---|---|---|
| 4,620,311 | 10/1986 | Schouhamer Immink | 375/19 |
| 4,775,985 | 10/1988 | Busby | 375/25 |
| 4,779,072 | 10/1988 | van Gestel | 341/59 |

FOREIGN PATENT DOCUMENTS

| 104700 | 4/1984 | European Pat. Off. |
| 333321 | 9/1989 | European Pat. Off. |
| 2099263 | 12/1982 | United Kingdom |

*Primary Examiner*—Stephen M. Baker
*Attorney, Agent, or Firm*—Henry E. Otto, Jr.

[57] ABSTRACT

A method for coding a binary data string for a partial-response channel having a transfer function with a spectral null at zero frequency to provide a coding rate 8/10 and an output which is invariant to 180-degree phase shifts in the channel output signal. A finite-state machine is created having two pairs of states and a plurality of codewords each corresponding to a respective binary data byte. The binary data string is encoded by said machine into a string of binary codewords having a power spectrum value of zero for a frequency of zero. In response to each successive data byte in the binary data string, there is generated one of two complementary codewords from the one of that pair of the states designated by said machine as corresponding to the data byte for the then current state of the machine. The sequence of said one complementary codewords is so decoded as to provide the same data output for said codeword sequence and its complement, irrespective of which of said complementary codewords was generated. The next state of said machine is preselected according to the value of the data byte and current state, and the next state for one element of a pair is the complement of the next state for the other element of the same pair.

7 Claims, 2 Drawing Sheets

PHASE INVARIANT RATE 8/10 MATCHED SPECTRAL NULL CODE FOR PRML

This is a continuation of copending application Ser. No. 07/434,970 filed on Nov. 13, 1989, now abandoned.

TECHNICAL FIELD

This invention relates to methods of coding input strings of binary data over partial-response channels using maximum-likelihood sequence detection (PRML). More particularly, it relates to methods employing an improved rate 8/10 matched spectral null trellis code for PRML channels which provides block decoding, phase reversal invariance, decreased encoder/decoder complexity, and elimination of quasi-catastrophic sequences, while maintaining high coding gain.

BACKGROUND OF THE INVENTION

The most pertinent prior art of which applicants are aware is their copending application, U.S. Ser. No. 07/169,920, filed Mar. 18, 1988, (now U.S. Pat. NO. 4,88,779 issued Dec. 19, 1989), and to the assigned to the present invention. A coding method for a constrained system using a rate 8/10 code with spectral null at $f=0$ is described therein. While the coding method therein described operates very satisfactorily to achieve the stated objectives, it is sensitive to phase shifts in channel output signal. As a result, an inversion of the signal polarity can cause error propagation at the output of the decoder. Also, the code on occasion generates quasi-catastrophic sequences. These sequences represent more than one distinct path through the canonical state diagrams that describe sequences with spectral null constraints. Quasi-catastrophic sequences degrade the worst case coding gain and result in decoding delays.

There is a need for a method employing a matched spectral null (MSN) trellis code that: (1) is indifferent to 180-degree phase shifts in channel output signal (an important consideration in magnetic recording, where the state of the write driver and polarity of recording head leads may be unknown); (2) eliminates all quasi-catastrophic sequences; (3) eliminates the need for differential encoding/decoding circuits typically required for application of phase invariant codes; (4) decreases encoder/decoder complexity relative to the 8/10 code described in the above-cited application; and (5) achieves the foregoing without reduction in the coding gain.

SUMMARY OF THE INVENTION

A method is described for coding a binary data string for a partial-response channel having a transfer function with a spectral null at zero frequency to provide a coding rate and an output which is invariant to 180-degree phase shifts in the channel output signal. A finite-state machine is created having a plurality of pairs of states and a plurality of codewords each corresponding to a respective binary data byte. The binary data string is encoded by said machine into a string of binary codewords having a power spectrum value of zero for a frequency of zero. In response to a data byte in the binary data string, one of two complementary codewords is generated from said binary codeword string. The said one complementary codeword is so decoded as to provide the same data byte output irrespective of which of said complementary codewords was generated. The next state of said machine is preselected according to the value of the data byte and current state, and the next state for one element of a pair is the complement of the next state for the other element of the same pair.

DESCRIPTION OF PREFERRED EMBODIMENT

According to the invention, an improved method is described for constructing a high rate 8/10 MSN trellis code for a partial response channel, such as a dicode (1-D) partial-response channel. The code can also be adapted to a class 4 ($1-D^2$) partial-response channel by interleaving using the technique disclosed, for example, in the December 1988 issue of the IBM Technical Disclosure Bulletin at pp. 476 et seq. These are among the codes of greatest current interest in magnetic and optical data recording.

As described in the above-cited copending application, an MSN trellis code spectrum is designed to have nulls at frequencies where the channel transfer function has a null, thereby providing improved coding gains and reduced Viterbi decoder complexity.

Figure 1:
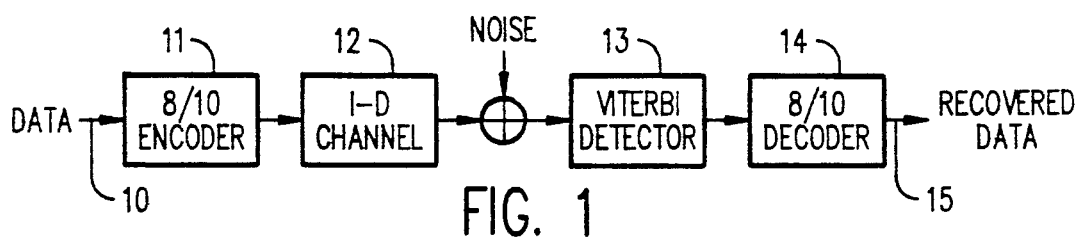
FIG. 1 is a block diagram of a recording system employing a trellis coding method according to the invention.

As illustrated in FIG. 1, input data, such as in the form of binary symbol strings, is transmitted from a bus 10 to a rate 8/10 finite-state-machine encoder 11. Encoder 11 produces a binary code symbol sequence that serves as input to a dicode (1-D) partial-response channel 12. This code has a power spectrum of zero for each frequency at which there is a zero in the transfer function of channel 12; i.e., the code sequences have spectral nulls that match those of the partial-response channel. A channel output sequence is generated by partial-response channel 12 and detected at the channel output by a Viterbi detector 13. This detector calculates the most probable code sequence from the channel output sequence. Detector 13 reduces computational and hardware requirements by tracking only the frequency spectral content of the channel output sequence, thereby producing a near maximum-likelihood estimate (or most probable code sequence) of the transmitted original data sequence supplied by the bus 10. A rate 8/10 decoder 14 then generates from the detected sequence the MSN code output data in a bus 15.

Table 1 shows the structure of the finite-state-machine encoder 11. As illustrated, the encoder 11 has four states designated by decimal numbers (0-3), and divided into two pairs 0,3 and 1,2. Within each pair, a given data byte will produce one of two complementary codewords, dependent upon which of the pair of states is the current state of the encoder. Data words are denoted by decimal numbers (0-255). Codewords are grouped into lists with similar properties (as hereinafter described) and designated by capital letters, with the size of the set indicated in parentheses. For example, F(10) denotes a list of 10 codewords (124, 188, 220, 236, 241, 242, 244, 248, 316 and 451, in decimal) designated by F. The notation $\overline{F}$ denotes the list of codewords which are obtained from the words in set F by bitwise complementing.

TABLE 1

| Finite-State-Machine Encoder Structure | | | |
|---|---|---|---|
| State | Data | Next | Codeword |
| 0 | 0-99 | 3 | A(100) |
| 0 | 100-142 | 2 | B (43) |
| 0 | 143-255 | 2 | C(113) |
| 1 | 0-9 | 2 | F (10) |
| 1 | 10-99 | 2 | D (90) |
| 1 | 100-142 | 0 | E (43) |
| 1 | 143-255 | 0 | $\overline{C}$(113) |
| 2 | 0-9 | 1 | $\overline{F}$ (10) |
| 2 | 10-99 | 1 | $\overline{D}$ (90) |
| 2 | 100-142 | 3 | $\overline{E}$ (43) |
| 2 | 143-255 | 3 | $\overline{C}$(113) |
| 3 | 0-99 | 0 | $\overline{A}$(100) |
| 3 | 100-142 | 1 | $\overline{B}$ (43) |
| 3 | 143-255 | 1 | $\overline{C}$(113) |

The codeword lists are characterized in a manner best explained by reference to the finite state transition diagram which describes the MSN constraint, which in this case corresponds to a spectral null at f=0.

Figure 2:
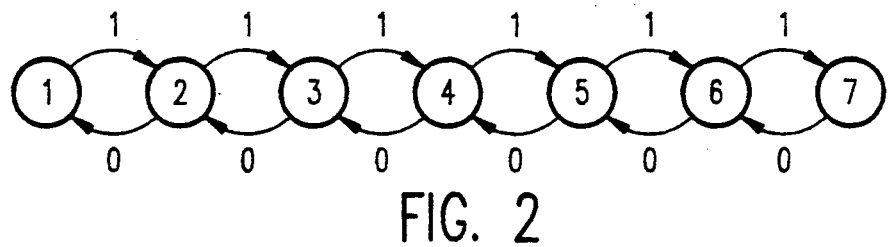
FIG. 2 depicts a seven-state subdiagram of the canonical diagram for binary sequences with spectral null at $f=0$.
Figure 3:
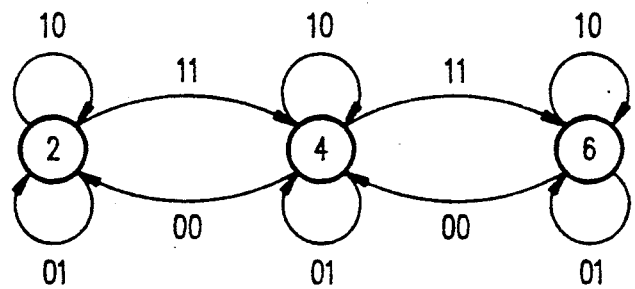
FIG. 3 depicts the component of the second power of the diagram shown in FIG. 2.

FIG. 2 shows a 7-state subdiagram of the canonical diagram for binary sequences with spectral null at f=0. The states are labelled 1 through 7. The paths in the diagram generate all binary sequences with digital sum variation (DSV) bounded by 6. The DSV corresponds to the maximum variation in the running digital sum value $$\sum_{i=1}^{N} (-1)^{a_i}$$

achieved by any sequence $a=a_1 \ldots a_N$ generated by the diagram. The component of the second power of the diagram of FIG. 2, which contains states 2, 4 and 6, is shown in FIG. 3. The edges in FIG. 3 correspond to pairs of edges in FIG. 2 and are labelled by pairs of binary symbols. The lists of codewords used in the finite-state-machine encoder 11 are best described in terms of the diagram in FIG. 3. FIG. 3 is used to derive the Viterbi detector trellis structure illustrated in FIG. 5. All codewords are 10 bits in length and are generated by paths of length 5 in FIG. 3.

List A: Consists of the 100 codewords generated by paths starting from state 2 and ending in state 6.
List B: Consists of the 43 sequences generated by paths from state 2 to state 4 which also pass through state 6.
List C: Consists of 113 of the 121 possible sequences generated by paths from state 2 to state 4 which do not pass through state 6.
List D: Consists of the 90 codewords generated by paths which start and end at state 4 which also pass through state but do not pass through state 6.
List E: Consists of the 43 sequences generated by paths from state 4 to state 2 which also pass through state 6.
List F: Consists of 10 of the 20 words which start and end at state 4 which also pass through both state 2 and state 6.

Table 2 gives a full description of the codeword lists, with the 10-bit words expressed in decimal. Lists are ordered left-to-right, row-by-row from top-to-bottom.

TABLE 2

| Codeword Lists (in Decimal) | | | | | | | | | |
|---|---|---|---|---|---|---|---|---|---|
| LIST A | | | | | | | | | |
| 351 | 367 | 375 | 379 | 381 | 382 | 415 | 431 | 439 | 443 |
| 445 | 446 | 463 | 471 | 475 | 477 | 478 | 487 | 491 | 493 |
| 494 | 499 | 501 | 502 | 505 | 506 | 607 | 623 | 631 | 635 |
| 637 | 638 | 671 | 687 | 695 | 699 | 701 | 702 | 719 | 727 |
| 731 | 733 | 734 | 743 | 747 | 749 | 750 | 755 | 757 | 758 |
| 761 | 762 | 799 | 815 | 823 | 827 | 829 | 830 | 847 | 855 |
| 859 | 861 | 862 | 871 | 875 | 877 | 878 | 883 | 885 | 886 |
| 889 | 890 | 911 | 919 | 923 | 925 | 926 | 935 | 939 | 941 |
| 942 | 947 | 949 | 950 | 953 | 954 | 967 | 971 | 973 | 974 |
| 979 | 981 | 982 | 985 | 986 | 995 | 997 | 998 | 1001 | 1002 |
| LIST B | | | | | | | | | |
| 380 | 444 | 476 | 492 | 497 | 498 | 500 | 504 | 636 | 700 |
| 732 | 748 | 753 | 754 | 756 | 760 | 828 | 860 | 876 | 881 |
| 882 | 884 | 888 | 924 | 940 | 945 | 946 | 948 | 952 | 963 |
| 965 | 966 | 969 | 970 | 972 | 977 | 978 | 980 | 984 | 993 |
| 994 | 996 | 1000 | | | | | | | |
| LIST C | | | | | | | | | |
| 343 | 347 | 349 | 350 | 359 | 363 | 365 | 366 | 371 | 373 |
| 374 | 377 | 378 | 407 | 411 | 413 | 414 | 423 | 427 | 429 |
| 430 | 435 | 437 | 438 | 441 | 442 | 455 | 459 | 461 | 462 |
| 467 | 469 | 470 | 473 | 474 | 483 | 485 | 486 | 489 | 490 |
| 599 | 603 | 605 | 606 | 615 | 619 | 621 | 622 | 627 | 629 |
| 630 | 633 | 634 | 663 | 667 | 669 | 670 | 679 | 683 | 685 |
| 686 | 691 | 693 | 694 | 697 | 698 | 711 | 715 | 717 | 718 |
| 723 | 725 | 726 | 729 | 730 | 739 | 741 | 742 | 745 | 746 |
| 791 | 795 | 797 | 798 | 807 | 811 | 813 | 814 | 819 | 821 |
| 822 | 825 | 826 | 839 | 843 | 845 | 846 | 851 | 853 | 854 |
| 857 | 858 | 867 | 869 | 870 | 873 | 874 | 903 | 907 | 909 |
| 910 | 915 | 917 | | | | | | | |
| LIST D | | | | | | | | | |
| 87 | 91 | 93 | 94 | 103 | 107 | 109 | 110 | 115 | 117 |
| 118 | 121 | 122 | 151 | 155 | 157 | 158 | 167 | 171 | 173 |
| 174 | 179 | 181 | 182 | 185 | 186 | 199 | 203 | 205 | 206 |
| 211 | 213 | 214 | 217 | 218 | 227 | 229 | 230 | 233 | 234 |
| 279 | 283 | 285 | 286 | 295 | 299 | 301 | 302 | 307 | 309 |
| 310 | 313 | 314 | 327 | 331 | 333 | 334 | 339 | 355 | 391 |
| 395 | 397 | 398 | 403 | 419 | 535 | 539 | 541 | 542 | 551 |
| 555 | 557 | 558 | 563 | 565 | 566 | 569 | 570 | 583 | 587 |
| 589 | 590 | 595 | 611 | 647 | 651 | 653 | 654 | 659 | 675 |
| LIST E | | | | | | | | | |
| 240 | 368 | 432 | 449 | 450 | 452 | 456 | 464 | 480 | 624 |
| 688 | 705 | 706 | 708 | 712 | 720 | 736 | 773 | 774 | 777 |
| 778 | 780 | 785 | 786 | 788 | 792 | 801 | 802 | 804 | 808 |
| 816 | 833 | 834 | 836 | 840 | 848 | 864 | 897 | 898 | 900 |
| 904 | 912 | 928 | | | | | | | |
| LIST F | | | | | | | | | |
| 124 | 188 | 220 | 236 | 241 | 242 | 244 | 248 | 316 | 451 |

It will be noted that the rate 8/10 code described herein does not employ any of the quasi-catastrophic sequences of the canonical state diagram.

Figure 4:
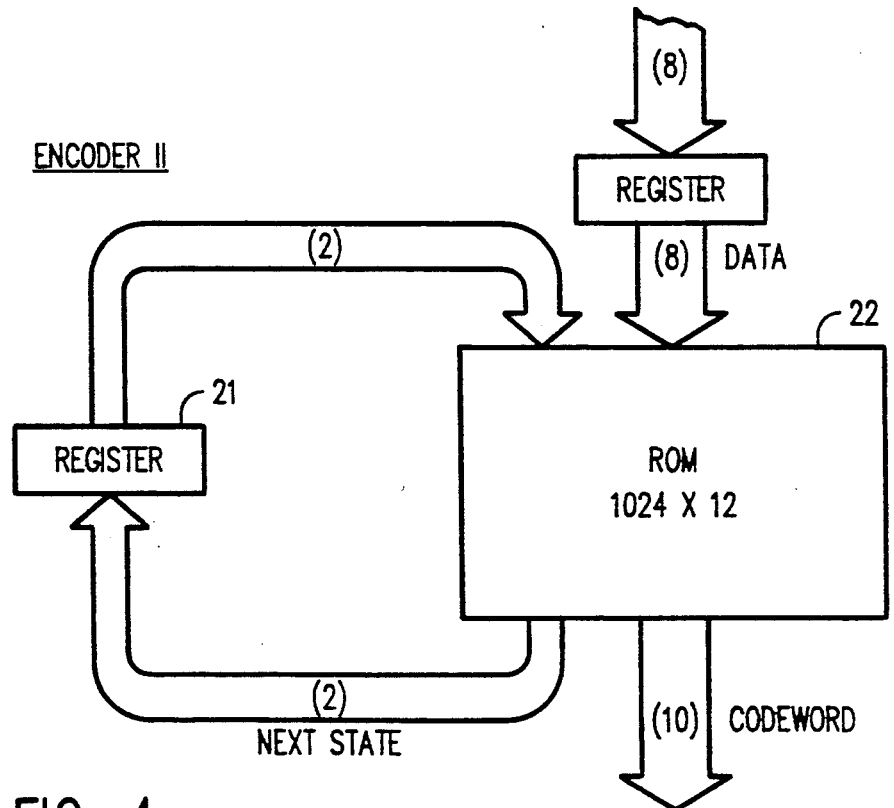
FIG. 4 depicts an encoder for implementing the invention.

FIG. 4 illustrates a read only memory (ROM) implementation of fininte-state-machine encoder 11 for the rate 8/10 trellis code. The ROM contents are derived directly from the right-most two columns of the finite-state-machine encoder Table 1. Encoder 11, as illustrated, comprises registers 20, 21 and a ROM 22. The 8-bit input data string is delayed one machine cycle by register 20 and then output to ROM 22. ROM 22 also receives a 2-bit input from register 21, which constitutes the current state of encoder 11. The output from ROM 22 is a 10-bit codeword, 2 bits of which are recirculated via register 21 for denoting the next state.

Encoder 11 generates a binary code sequence that is input to the dicode partial-response channel 12. The output sequence generated by channel 12, affected by noise, is detected by Viterbi detector 13.

Figure 5:
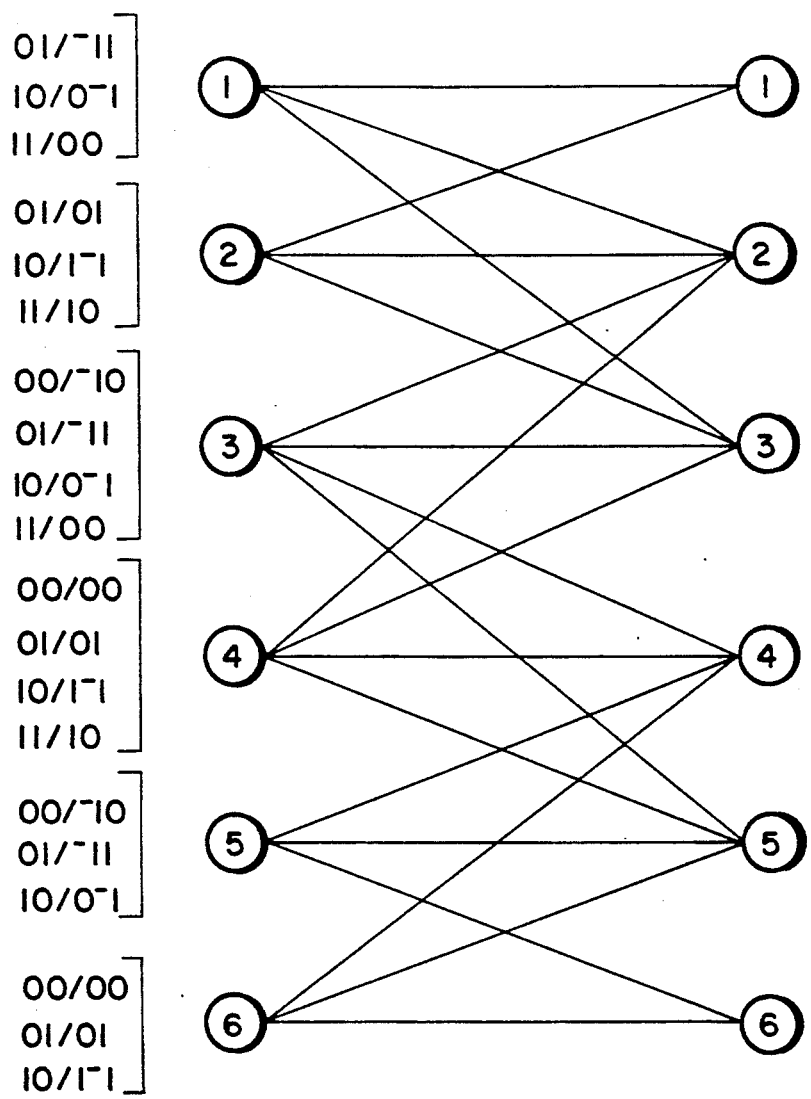
FIG. 5 depicts a trellis structure for an MSN Viterbi detector.

FIG. 5 shows the reduced complexity trellis structure of Viterbi detector 13 for the rate 8/10 MSN trellis code. Detector 13 is similar to that described in the above-cited copending application. It calculates most probable code sequence from the output sequence of channel 12. Detector 13 reduces computational and hardware requirements by tracking only the frequency spectral content of the channel output sequence, thereby to produce a near maximum-likelihood estimate (or most probable code sequence) of the original data sequence supplied via bus 10.

The trellis is derived from the diagram in FIG. 3, and represents the possible sequences at the output of dicode channel 12 when the channel inputs are generated by FIG. 3. The edges are labelled by $u_1u_2/v_1v_2$ where $u_1u_2$ are code symbols and $v_1v_2$ are channel output symbols. The free Euclidean distance of the trellis, $d^2_{free}$, is the minimum squared Euclidean distance between trellis-coded channel output sequences which start from the same state and remerge after a finite number of steps. It can be checked that $d^2_{free}=4$, indicating a potential 3 dB gain over an uncoded dicode channel.

The Viterbi algorithm for the trellis in FIG. 5 is derived according to conventional methods such as described in the March 1973 issue of IEEE Proceedings at pp. 268-278. The survivor metric update rules are given in detail in Table 3. Survivor path extensions are determined on the basis of the metric update computation in the usual manner (Add-Compare-Select).

TABLE 3

| Algorithm: Metric Update Equations |
| --- |
| $M_{n+1}(1)=\min\{M_n(1)+2-2z_1-2z_2, M_n(2)+1-2z_2\}$ |
| $M_{n+1}(2)=\min\{M_n(1)+1+2z_2, M_n(2)+2-2z_1+2z_2, M_n(3)+1+2z_1, M_n(4)\}$ |
| $M_{n+1}(3)=\min\{M_n(1), M_n(2)+1-2z_1, M_n(3)+2+2z_1-2z_2, M_n(4)+1-2z_2\}$ |
| $M_{n+1}(4)=\min\{M_n(3)+1+2z_2, M_n(4)+2-2z_1+2z_2, M_n(5)+1+2z_1, M_n(6)\}$ |
| $M_{n+1}(5)=\min\{M_n(3), M_n(4)+1-2z_1, M_n(5)+2+2z_1-2z_2, M_n(6)+1-2z_2\}$ |
| $M_{n+1}(6)=\min\{M_n(5)+1+2z_2, M_n(6)+2-2z_1+2z_2\}$ | where $M_n(j)$ is the survivor metric for state j at time n, where j varies from 1 to 6; and $3_1$ and $3_2$ represent two consecutive output signals from the channel.

According to an important feature of the invention, the rate 8/10 code is decoded with block decoder 14 that provides an output (see Table 4) which is the same for a codeword or its complement. Decoder 14 generates, from the detected sequence, the MSN code output data which is transmitted to bus 15.

Decoder 14 requires no look-ahead to decode the current codeword. For the current 10-bit codeword y, decoder 14 determines an 8-bit word w according to Table 4. The maximum error propagation due to a single bit error at the decoder input is therefore one byte.

TABLE 4

| Initial Look-up Table for Decoder 14 | |
| --- | --- |
| A | |
| | 0-99 |
| $\overline{A}$ | |
| B | |
| | 100-142 |
| $\overline{B}$ | |
| C | |
| | 143-255 |
| $\overline{C}$ | |
| D | |
| | 10-99 |
| $\overline{D}$ | |
| E | |
| | 100-142 |
| $\overline{E}$ | |
| F | |
| | 0-9 |

TABLE 4-continued

| Initial Look-up Table for Decoder 14 |
| --- |
| $\overline{F}$ |

Figure 6:
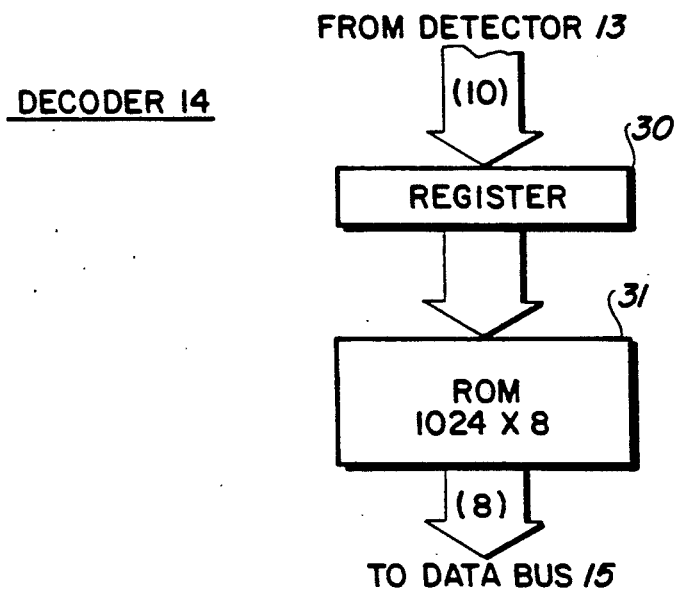
FIG. 6 depicts a block decoder for implementing the invention.

Decoder 14 may, for sake of illustration, be of the type shown in FIG. 6 for implementing the block decoder algorithm just described.

Decoder 14 comprises a register 30 which receives the 10-bit most probable code sequence codeword from detector 13. This codeword is transmitted to a 1024×8 bit read only memory (ROM) 31. Using look-up Table 4, ROM 31 decodes the 10-bit codeword into an 8-bit output. The 8-bit output of ROM 31 is transmitted to data bus 15. As a result of the structuring of the contents of ROM 31, the MSN code output data in bus 15 will be the same for a given codeword or its complement.

The method according to the invention has been described with reference to an 8/10 coding rate. However, it will be understood that this method may be used with codes with other coding rates.

While the invention has been particularly shown and described with reference to a preferred embodiment thereof, it will be understood by those skilled in the art that various other changes in the form and details may be made therein without departing from the spirit and scope of the invention. Accordingly, the method herein disclosed is to be considered merely as illustrative and the invention is to be limited only as specified in the claims.

We claim:

1. A method for coding a binary data string for a partial-response channel having a transfer function with a spectral null at zero frequency, said method comprising the steps of:

(a) providing from a matched spectral null canonical state diagram a code which does not generate quasi-catastrophic sequences and having a coding rate and an output which is invariant to 180- degree phase shifts in a channel output signal;

(b) creating a finite-state machine having a plurality of pairs of states and a plurality of codewords each corresponding to a respective binary data byte;

(c) responsive to a data byte in the binary data string, generating one of two complementary codewords from the one of that pair of said states designated by said machine as corresponding to said data byte for a then current state of the machine for thereby encoding the binary data string into a string of binary codewords having a spectral null constraint producing a power spectrum value of zero for a frequency of zero;

(d) providing a Viterbi detector;

(e) matching a trellis in the Viterbi detector to the spectral null constraint for generating from a potentially noisy channel output signal an estimate of the most probable sequence of binary codewords produced by said finite-state machine; and (f) without look-ahead or look-back, decoding said one complementary codeword in such manner as to provide the same data byte output irrespective of which of said complementary codewords was generated.

2. The method of claim 1, including the step of:

(g) preselecting a next state of said machine dependent upon which of the states in said pair is the current state, said next state for the element of a pair being the complement of the next state for the other element of the same pair.

3. The method of claim 1, including implementing step (f) by decoding said one complementary codeword by table lookup.

4. The method of claim 1, wherein the channel is a dicode (1-D) channel, and the output has an 8/10 coding rate.

5. A method for coding a binary data string for a partial-response channel having a transfer function with a spectral null at zero frequency, said method comprising the steps of:

(a) providing from a matched spectral null canonical state diagram a code which does not generate quasi-catastrophic sequences and having a coding rate and an output which is invariant to 180-degree phase shifts in a channel output signal;

(b) creating a fininte-state machine having a plurality of pairs of states and a plurality of codewords each corresponding to a respective binary data byte;

(c) responsive to a data byte in the binary data string, generating one of two complementary codewords from the one of that pair of said states designated by said machine as corresponding to said data byte for a then current state of the machine for thereby encoding the binary data string into a string of binary codewords having a spectral null constraint producing a power spectrum value of zero for a frequency of zero;

(d) repeating step (c) for successive bytes of the binary data string to generate a sequence of codewords; and (e) providing a Viterbi detector having a finite path memory;

(f) matching a trellis in the Viterbi detector to the spectral null constraint for generating from a potentially noisy channel output signal an estimate of the most probable sequence of binary codewords produced by said finite-state machine; and (g) decoding said sequence of codewords in a decoder requiring no look-ahead or look-back for providing the same binary data string output for said sequence or its complement.

6. The method of claim 5, including implementing step (g) by decoding the codewords of a sequence one codeword at a time by table lookup.

7. The method of claim 5, wherein the channel is a dicode (1-D) channel, and the output has an 8/10 coding rate.

* * * * *